US012575378B2

(12) United States Patent
Yeh et al.

(10) Patent No.: US 12,575,378 B2
(45) Date of Patent: Mar. 10, 2026

(54) WAFER HANDLING DEVICE AND SUCKER MODULE THEREOF

(71) Applicant: Wistron Corporation, New Taipei City (TW)

(72) Inventors: Shun-Chi Yeh, New Taipei City (TW); Fu-Hua Yan, New Taipei City (TW); Ze-Shan Yan, New Taipei City (TW); Xiao-Mei Zhang, New Taipei City (TW)

(73) Assignee: WISTRON CORPORATION, New Taipei City (TW)

( * ) Notice: Subject to any disclaimer, the term of this patent is extended or adjusted under 35 U.S.C. 154(b) by 522 days.

(21) Appl. No.: 18/182,699

(22) Filed: Mar. 13, 2023

(65) Prior Publication Data
US 2024/0194515 A1     Jun. 13, 2024

(30) Foreign Application Priority Data

Dec. 7, 2022    (CN) .......................... 202211563592.9

(51) Int. Cl.
| | |
|---|---|
| *H01L 21/683* | (2006.01) |
| *B25B 11/00* | (2006.01) |
| *B25J 9/16* | (2006.01) |
| *B25J 15/06* | (2006.01) |
| *H01L 21/67* | (2006.01) |
| *H10P 72/00* | (2026.01) |
| *H10P 72/10* | (2026.01) |
| *H10P 72/78* | (2026.01) |

(52) U.S. Cl.
CPC ............ *H10P 72/78* (2026.01); *B25B 11/005* (2013.01); *B25J 9/1697* (2013.01); *B25J 15/0616* (2013.01); *H10P 72/0606* (2026.01); *H10P 72/16* (2026.01)

(58) Field of Classification Search
CPC ................. H01L 21/6838; H01L 21/67; H01L 21/67259; H01L 21/67333; H01L 21/677; H01L 21/67126; B25B 11/005; B25J 15/0616; B25J 9/1697; H10P 72/78; H10P 72/0606; H10P 72/16
USPC ......................................................... 269/21
See application file for complete search history.

(56) References Cited

U.S. PATENT DOCUMENTS

| | | | | |
|---|---|---|---|---|
| 2002/0070491 A1* | 6/2002 | Schmalz | ................ | B23Q 1/037 |
| | | | | 269/21 |
| 2016/0379863 A1* | 12/2016 | Naor | ................. | H01L 21/68707 |
| | | | | 414/800 |
| 2019/0221467 A1* | 7/2019 | Scholz-Goerlach | ......................... | |
| | | | | B25B 11/005 |

FOREIGN PATENT DOCUMENTS

| | | | | | |
|---|---|---|---|---|---|
| CN | 118404614 A | * | 7/2024 | .......... | B25J 15/0683 |

* cited by examiner

*Primary Examiner* — Mahdi H Nejad
(74) *Attorney, Agent, or Firm* — McClure, Qualey & Rodack, LLP

(57) ABSTRACT

A wafer handling device is configured to transport a wafer tray. The wafer handling device includes a sucker module and a transporting apparatus. The sucker module includes a sucker body, at least one airtight assembly, and a pump. The sucker body includes a first portion and a second portion. The first portion has a hole and a first air sucking hole. The second portion has a second air sucking hole. The airtight assembly is connected to the hole. The pump has a suction tube connected to the first air sucking hole and the second air sucking hole. The transporting apparatus is configured to move the sucker body. When the sucker body is connected to the wafer tray, the first portion, the second portion, and the wafer tray form an airtight space.

18 Claims, 11 Drawing Sheets

WAFER HANDLING DEVICE AND SUCKER MODULE THEREOF

CROSS-REFERENCE TO RELATED APPLICATION

This non-provisional application claims priority under 35 U.S.C. § 119(a) to Patent Application No. 202211563592.9 filed in China, P.R.C. on Dec. 7, 2022, the entire contents of which are hereby incorporated by reference.

BACKGROUND

Technical Field

The present invention relates to a wafer handling device and a sucker module thereof, and in particular, to a wafer handling device that sucks and moves a wafer tray by using a sucker module and a sucker module thereof.

Related Art

During assembly of a wafer product, the wafer product is held from around through a pneumatic jaw, and then is moved through the pneumatic jaw for alignment and assembly. However, since a plurality of electronic elements are arranged on the wafer product, when the pneumatic jaw holds the wafer product from around, the wafer product is bent and depressed due to the gravity. If the pneumatic jaw aligns the wafer product in the bent state, after the pneumatic jaw releases the wafer product at an assembly position, the wafer product is restored to the original state due to release from the around holding by the pneumatic jaw. Therefore, the wafer product deviates from the original alignment and assembly position. To solve the problem, the pneumatic jaw needs to repeatedly hold the wafer product and re-align the wafer product until the wafer product is correctly positioned in the assembly position. Grasping the wafer product many times for alignment may reduce the production efficiency or even damage the electronic elements on the wafer product.

SUMMARY

In view of the above, in some embodiments, a wafer handling device is provided, which is configured to transport a wafer tray. The wafer handling device includes a sucker module and a transporting apparatus. The sucker module includes a sucker body, an airtight assembly, and a pump. The sucker body includes a first portion and a second portion. Each of the first portion has a hole and a first air sucking hole. The second portion has a second air sucking hole. The airtight assembly is connected to the hole. The pump includes a suction tube connected to the first air sucking hole and the second air sucking hole. The transporting apparatus is configured to move the sucker body. When the sucker body is connected to a wafer tray, the at least one first portion, the at least one second portion, and the wafer tray form an airtight space.

In some embodiments, the sucker body further includes a third portion, the third portion includes an abutting portion, and the first portion, the second portion, the third portion, and the wafer tray form the airtight space when the abutting portion abuts against the wafer tray.

In some embodiments, a second accommodating height of the at least one second portion is greater than a first accommodating height of the at least one first portion.

In some embodiments, the airtight assembly further includes a rod body and a blocking portion, the rod body is located in the hole, and the blocking portion protrudes from an end of the hole.

In some embodiments, a distance between the blocking portion and the hole is greater than the first accommodating height, and the distance is adjusted to the first accommodating height when the sucker body is connected to the wafer tray.

In some embodiments, the airtight assembly further includes a positioning sleeve and an elastic element, the positioning sleeve is fixed in the hole, the rod body includes a stopping portion extending in a radial direction, and the stopping portion is located between the positioning sleeve and the blocking portion. The elastic element is sleeved between the rod body and the positioning sleeve, and the stopping portion compresses the elastic element to move the blocking portion to the first accommodating height.

In some embodiments, each of the airtight assembly further includes a connecting portion, the rod body is located between the blocking portion and the connecting portion, the connecting portion protrudes from an other end of the hole, and the rod body has a vent channel that is in communication with the connecting portion and the blocking portion.

In some embodiments, a plurality of airtight assemblies are arranged, each of the plurality of the airtight assemblies includes a connecting tube, and each connecting tube is connected to the connecting portions of two of plurality of the airtight assemblies.

In some embodiments, a partition wall is provided between the first portion and the second portion, and the partition wall separates the first portion from the second portion.

In some embodiments, the sucker body has a fixing hole. The transporting apparatus further includes a fixing frame, a visual module, and a controller. The fixing frame includes a first fixing portion and a second fixing portion. The first fixing portion is connected to the fixing hole, the second fixing portion is connected to the transporting apparatus, and the fixing frame includes an extended support. The visual module is connected to the extended support, and is configured to obtain a first positioning image and a second positioning image. The controller is configured to generate a first driving signal according to the first positioning image and generate a second driving signal according to the second positioning image.

In some embodiments, the transporting apparatus further includes a lighting module, and the lighting module is connected to the extended support and is configured to generate a light source.

In some embodiments, a sucker module is provided, including a sucker body, an airtight assembly, and a pump. The sucker body includes a first portion and a second portion. Each of the first portion has a hole and a first air sucking hole. The second portion has a second air sucking hole. The airtight assembly is connected to the hole. The pump includes a suction tube connected to the first air sucking hole and the second air sucking hole. When the sucker body is connected to a wafer tray, the at least one first portion, the at least one second portion, and the wafer tray form an airtight space.

DETAILED DESCRIPTION

Figure 1:
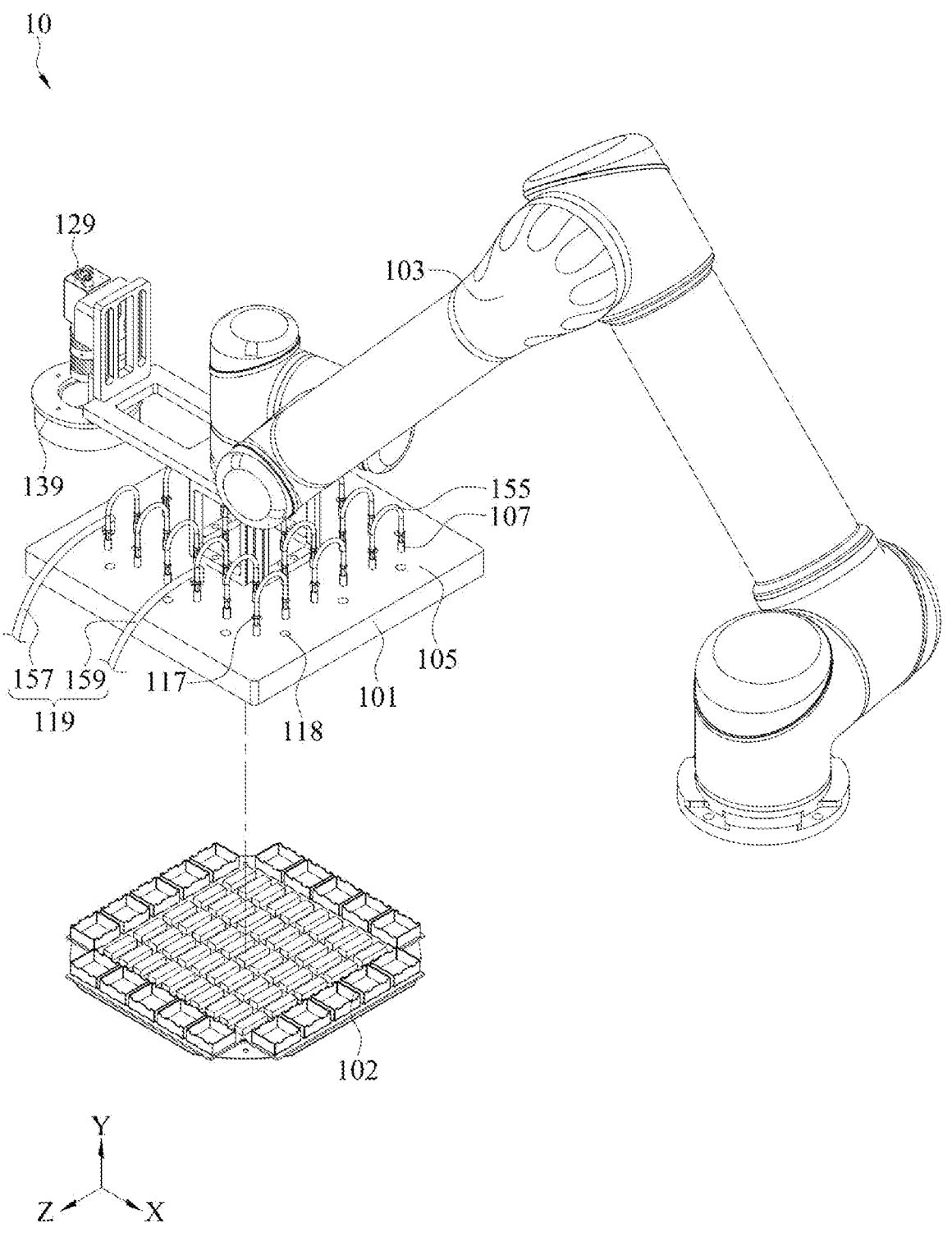
FIG. 1 is a three-dimensional view of a wafer handling device according to some embodiments of the present invention.

Various embodiments are provided below for detailed description. However, the embodiments are merely used as examples for description, and do not limit the protection scope of the present invention. In addition, some elements are omitted in the drawings in the embodiments, to clearly show technical features of the present invention. The same reference numeral is used to indicate the same or similar elements in all of the drawings.

Figure 2:
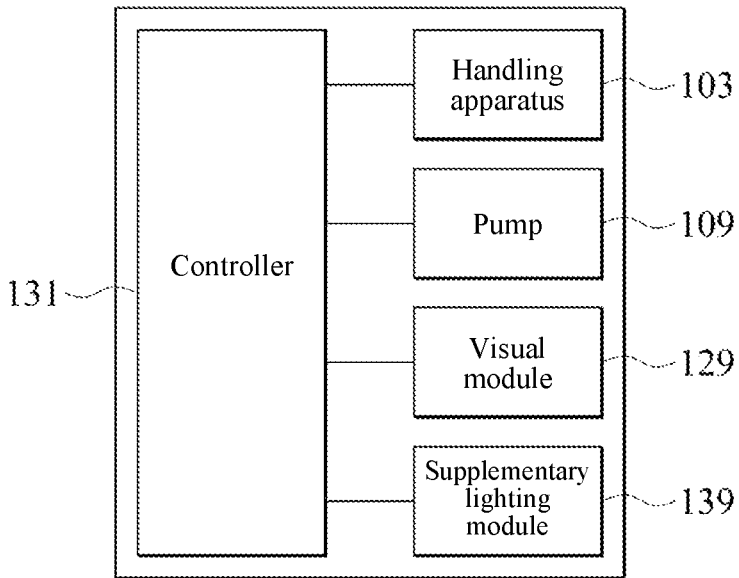
FIG. 2 is a block diagram of the wafer handling device according to some embodiments of the present invention.
Figure 3:
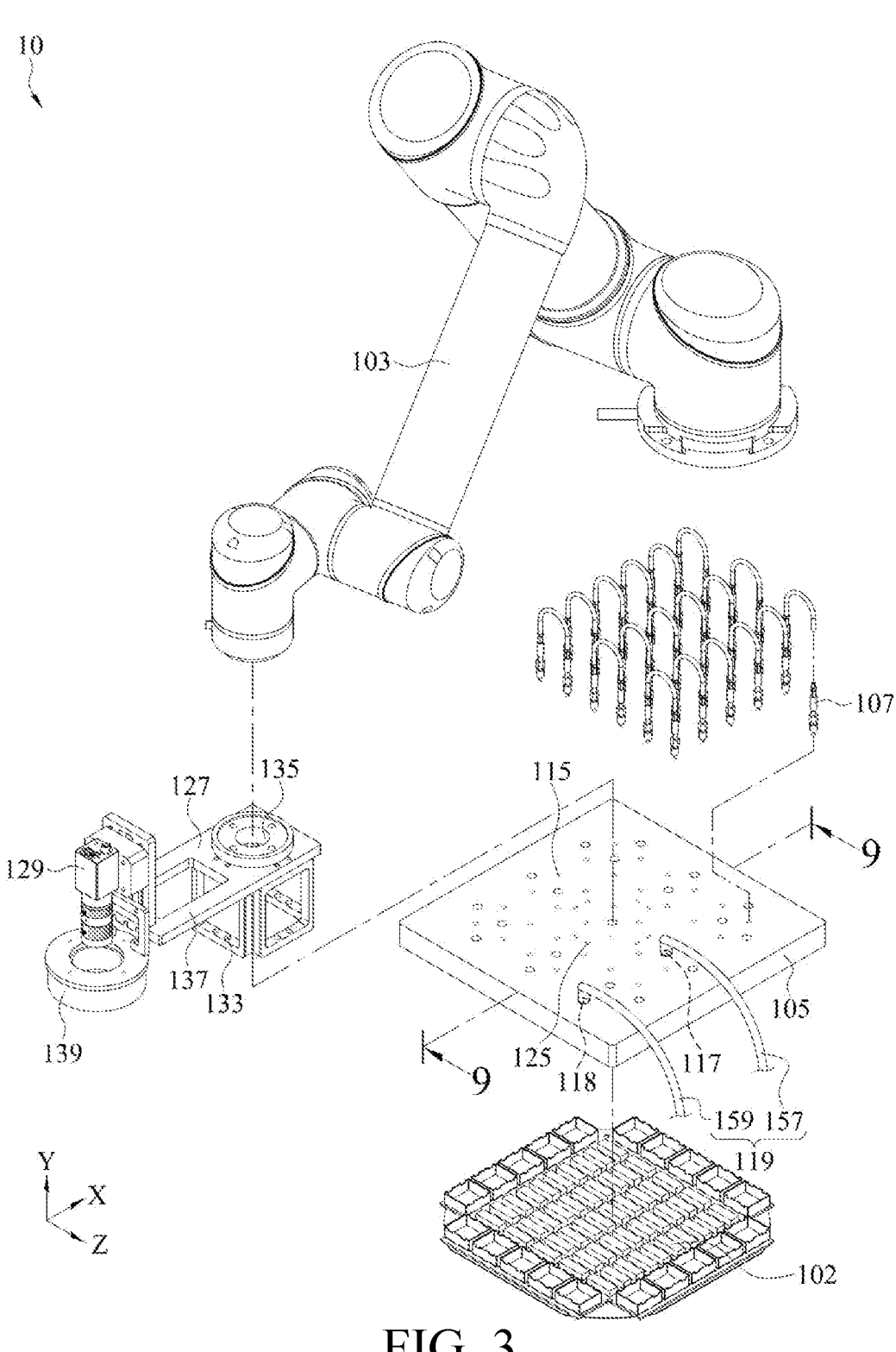
FIG. 3 is an exploded view of the wafer handling device according to some embodiments of the present invention.
Figure 4:
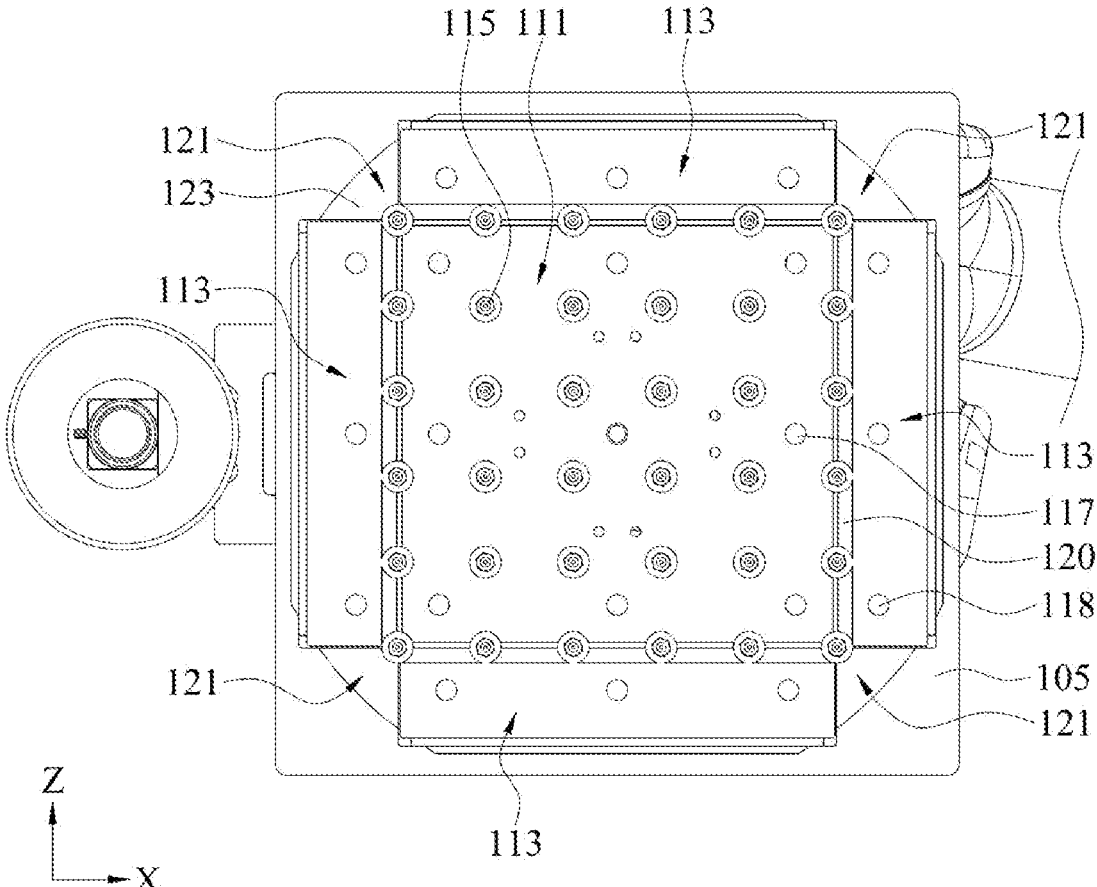
FIG. 4 is a schematic structural diagram of a sucker module according to some embodiments of the present invention, showing a first portion, a second portion, and a third portion.

Refer to FIG. 1 to FIG. 4. FIG. 1 is a three-dimensional view of a wafer handling device according to some embodiments of the present invention. FIG. 2 is a block diagram of the wafer handling device according to some embodiments of the present invention. FIG. 3 is an exploded view of the wafer handling device according to some embodiments of the present invention. FIG. 4 is a schematic structural diagram of a sucker module according to some embodiments of the present invention, showing a first portion, a second portion, and a third portion. As shown in FIG. 1 to FIG. 4, in some embodiments, a wafer handling device 10 is configured to transport a wafer tray 102. The wafer handling device 10 includes a sucker module 101 and a transporting apparatus 103. The sucker module 101 includes a sucker body 105, an airtight assembly 107, and a pump 109. The sucker body 105 includes at least one first portion 111 and at least one second portion 113. The first portion 111 has a hole 115 and a first air sucking hole 117. The second portion 113 has a second air sucking hole 118. The airtight assembly 107 is connected to the hole 115. The pump 109 has a suction tube 119. The suction tube 119 is connected to the first air sucking hole 117 and the second air sucking hole 118. The transporting apparatus 103 is connected to the sucker body 105. The transporting apparatus 103 is configured to move the sucker body 105. When the sucker body 105 is connected to the wafer tray 102, the first portion 111, the second portion 113, and the wafer tray 102 form an airtight space.

As shown in FIG. 1, in some embodiments, the sucker module 101 sucks and carries the wafer tray 102 through the sucker body 105. When the sucker body 105 is connected to the wafer tray 102, the first portion 111 and the second portion 113 respectively form the airtight space with the wafer tray 102, and the pump 109 is actuated to suck air from the first portion 111 and the second portion 113, so that air pressures in the first portion 111 and the second portion 113 reach a preset negative pressure value. It should be noted that a specification of the sucker module 101 corresponds to a specification (including a size, a shape, and a location of an electronic element) of the wafer tray 102, so that the airtight space formed after the sucker module 101 is engaged with the wafer tray 102 has excellent airtightness. In addition, before a handling operation of the wafer tray 102, an operator may place a corresponding sucker module 101 according to the specification of the to-be carried wafer tray 102.

As shown in FIG. 4, in some embodiments, a partition wall 120 is provided between the first portion 111 and the second portion 113. When the sucker body 105 is connected to the wafer tray 102, the partition wall 120 can separate the first portion 111 from the second portion 113. In this way, when the pump 109 extracts the air from the first portion 111 and the second portion 113, each of the first portion 111 and the second portion 113 forms the airtight space with the wafer tray 102, which improves the airtightness of the airtight space.

As shown in FIG. 4, when the sucker body 105 is connected to the wafer tray 102, the first portion 111 and the second portion 113 can form the airtight space with the wafer tray 102. In order to enhance the airtightness of the airtight space, in some embodiments, the sucker body 105 further includes at least one third portion 121. The third portion 121 includes an abutting portion 123. The first portion 111, the second portion 113, the third portion 121, and the wafer tray 102 form the airtight space when the sucker body 105 is connected to the wafer tray 102 and the abutting portion 123 abuts against the wafer tray 102. Specifically, when the sucker body 105 is connected to the wafer tray 102, the sucker body 105 may be engaged with the wafer tray 102 and the abutting portion 123 may abut against the wafer tray 102, and block a gap or a through hole between the first portion 111 and the second portion 113, and the wafer tray 102. When the pump 109 is actuated to cause the air pressures between the first portion 111, the second portion 113, and the third portion 121 and the wafer tray 102 to reach the preset negative pressure value, since the abutting portion 123 has blocked the gap between the sucker body 105 and the wafer tray 102, the preset negative pressure value may be kept between the first portion 111, the second portion 113, and the third portion 121 and the wafer tray 102 respectively. In this way, the airtightness of the airtight space can be kept at the preset negative pressure value during handling of the wafer tray 102 by the sucker body 105, so that the sucker body 105 can stably carry the wafer tray 102.

Figure 5:
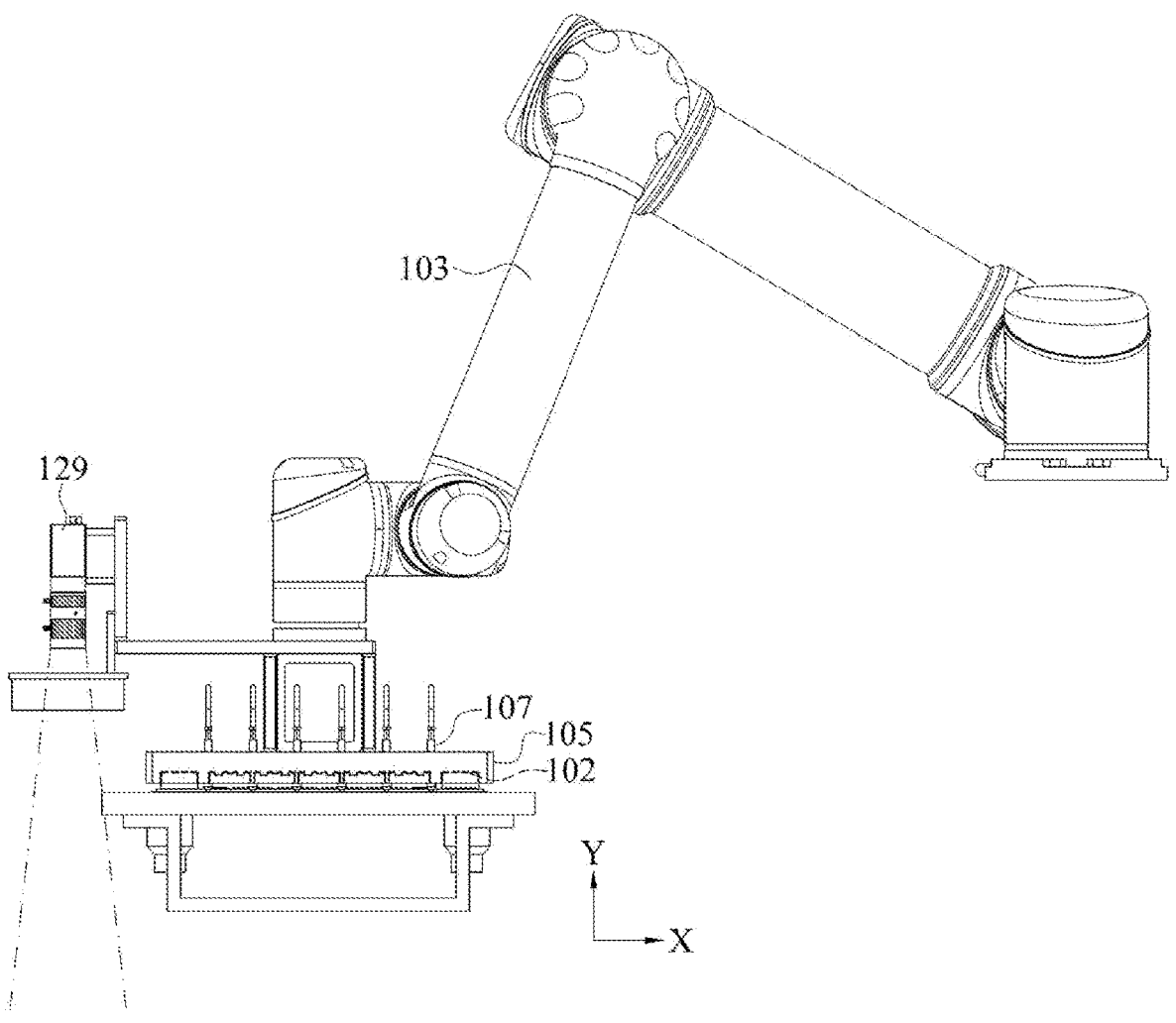
FIG. 5 is a schematic diagram showing a transporting apparatus which is handling a wafer tray with a sucker body connected to the wafer tray when the transporting apparatus performs a first handling motion, according to some embodiments of the present invention.
Figure 6:
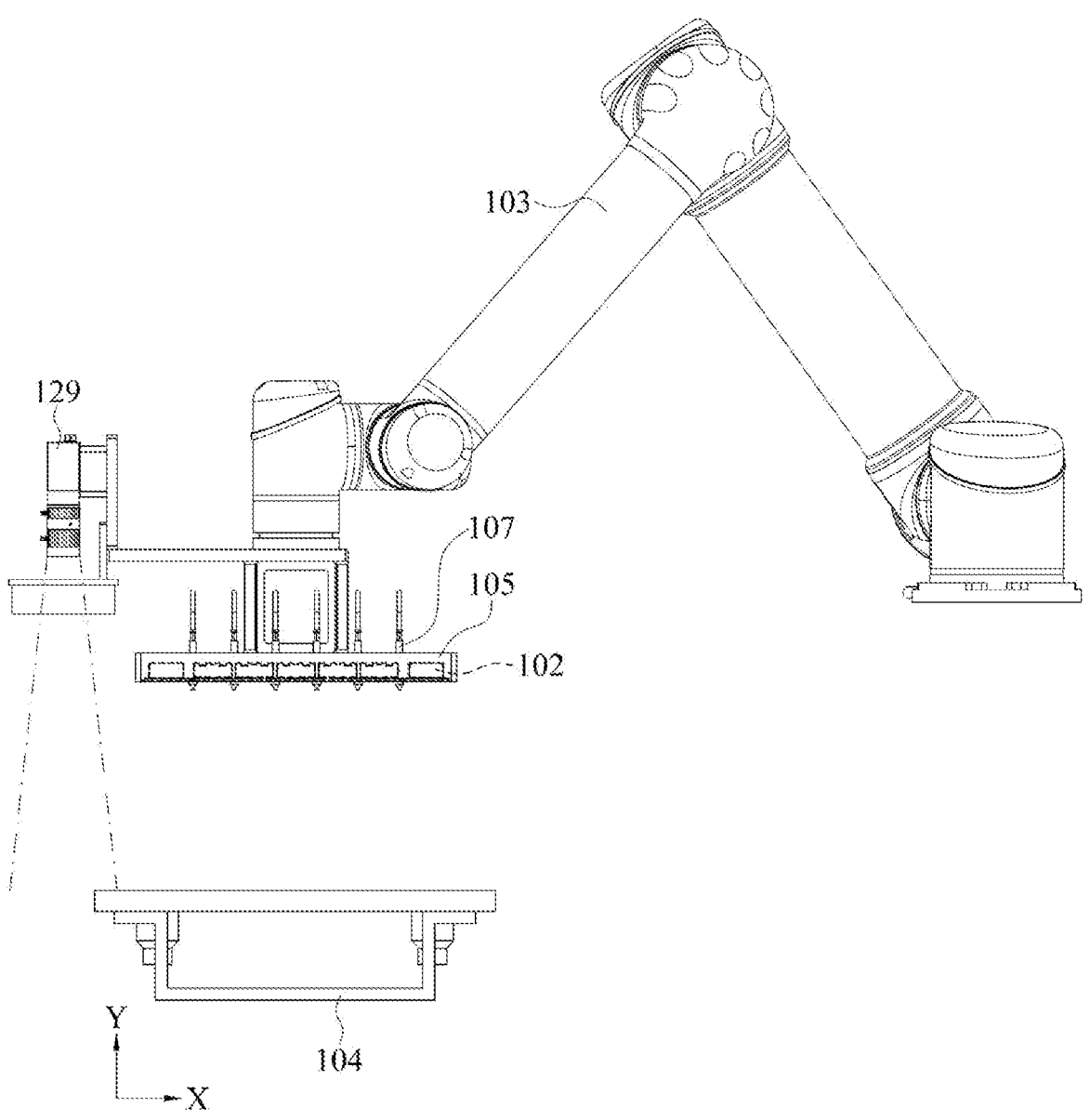
FIG. 6 is a schematic diagram showing the transporting apparatus which is placing the wafer tray on a carrying member when the transporting apparatus performs a second handling motion, according to some embodiments of the present invention.

Refer to FIG. 5 and FIG. 6 together. FIG. 5 is a schematic diagram showing a transporting apparatus which is handling a wafer tray with a sucker body connected to the wafer tray when the transporting apparatus performs a first handling motion, according to some embodiments of the present invention. FIG. 6 is a schematic diagram showing the transporting apparatus which is placing the wafer tray on a carrying member when the transporting apparatus performs a second handling motion, according to some embodiments of the present invention. As shown in FIG. 1 to FIG. 6, in some embodiments, the transporting apparatus 103 may be, for example, a robot arm. The transporting apparatus 103 may move the sucker module 101 and the wafer tray 102 according to a multi-axial moving trajectory. As shown in FIG. 5, in some embodiments, the transporting apparatus 103 may perform a first handling motion after receiving a first driving signal. The first handling motion may mean that the transporting apparatus 103 moves the sucker body 105 and engages the sucker body with the wafer tray 102. When the sucker body 105 is connected to the wafer tray 102, the sucker body 105 may be engaged with the wafer tray 102 and form the airtight space. It should be noted that when the sucker body 105 is connected to the wafer tray 102, the sucker module 101 may actuate the pump 109 to suck the air between the first portion 111 and the second portion 113 and the wafer tray 102, so that the air pressure among the first portion 111, the second portion 113, and the wafer tray 102 reaches the preset negative pressure value. In addition, when the airtight space is kept at the preset negative pressure value, the sucker body 105 can suck the wafer tray 102, so that the transporting apparatus 103 can handle the wafer tray 102 through the sucker body 105. Therefore, the negative pressure value of the airtight space may be a value of a negative pressure value for the sucker body 105 to suck the wafer tray 102. It should be noted that the wafer tray 102 may vary in weight due to a wafer layout. Therefore, a user may set the pump 109 according to the specification of the wafer tray 102, so that the airtight space can reach a proper negative pressure value.

The first handling motion may be performed after the transporting apparatus 103 receives the first driving signal, and may be stopped when the first handling motion is completed. As shown in FIG. 6, in some embodiments, the transporting apparatus 103 may perform a second handling motion after receiving a second driving signal. The second handling motion may mean that the transporting apparatus 103 moves the sucker body 105 and the wafer tray 102 to a storage position. As shown in FIG. 6, the storage position may be a position where the wafer tray 102 is placed on a carrying member 104. Specifically, when the transporting apparatus 103 places the wafer tray 102 on the carrying member 104 according to the second handling motion, the pump 109 may restore the air pressure among the first portion 111, the second portion 113, and the wafer tray 102 to a normal pressure value (or a negative pressure value allowing the sucker body 105 to be separated from the wafer tray 102), so that the sucker body 105 can be separated from the wafer tray 102. The second handling motion may be performed after the transporting apparatus 103 receives the second driving signal, and the transporting apparatus 103 returns to a state prior to performing the first handling motion and after completing the second handling motion. The carrying member 104 may be, for example, a cooling plate, a conveyor belt, or a process machine. In some embodiments, the transporting apparatus 103 may preset a motion trajectory parameter according to an operation environment, so that the transporting apparatus 103 may generate a corresponding movement (such as the first handling motion or the second handling motion) according to the motion trajectory parameter. The motion trajectory parameter may be stored in the transporting apparatus 103 or a controller (which is described later).

After the airtight assembly 107 is connected to the hole 115, the airtight assembly 107 is configured to keep the first portion 111, the second portion 113, and the wafer tray 102 to form the airtight space when the sucker body 105 is connected to the wafer tray 102. A number of airtight assemblies 107 may be increased according to a number of the holes 115, so that each of the holes 115 is provided with the airtight assembly 107. In addition, when the sucker body 105 is connected to the wafer tray 102, the airtight assembly 107 may generate a support force at a plurality of positions of the wafer tray 102. That is to say, each airtight assembly 107 may apply a support force at the plurality of positions of the wafer tray 102 uniformly to prevent the wafer tray 102 from bending and deforming during the handling. For example, when the pump 109 is actuated to cause the first portion 111 and the second portion 113 to form the airtight space with the wafer tray 102, the wafer tray 102 is attracted by the negative pressures of the first portion 111 and the second portion 113, so that the wafer tray 102 can be prevented from drooping and deforming due to the weight thereof. In addition, each airtight assembly 107 may alternatively be pushed against a different position of the wafer tray 102, so that the wafer tray 102 is prevented from being toward the sucker body 105 and deforming as a result of the negative pressure. When the airtight assembly 107 is pushed against the wafer tray 102, the airtight assembly 107 may be compressed to a proper length and continuously applies the support force to the wafer tray 102 (which is described later).

The pump 109 is configured to suck the air among the first portion 111, the second portion 113, and the wafer tray 102. Specifically, after the pump 109 is actuated, the pump 109 may perform a sucking operation through the suction tube 119 to suck the air from the first portion 111 and the second portion 113, so that the air pressures between the first portion 111 and the second portion 113 and the wafer tray 102 reach the preset negative pressure value. In some embodiments, the pump 109 may be linked to the transporting apparatus 103. When the sucker body 105 is connected to the wafer tray 102, the pump 109 may apply a negative or normal pressure to the first portion 111 and the second portion 113. For example, after the transporting apparatus 103 moves the sucker body 105 and the sucker body is connected to the wafer tray 102, the pump 109 may start the sucking operation, so that the air pressures between the first portion 111 and the second portion 113 and the wafer tray 102 reach the preset negative pressure value, and the sucker body 105 may handle the wafer tray 102 through the negative pressure. In addition, after the transporting apparatus 103 handles the wafer tray 102 to the carrying member 104, the pump 109 may discharge the air into the first portion 111 and the second portion 113, so that the air pressures between the first portion 111 and the second portion 113 and the wafer tray 102 return to the normal pressure value (or the negative pressure value allowing the sucker body 105 to be separated from the wafer tray 102), and the sucker body 105 is separated from the wafer tray 102. In some embodiments, the pump 109 may adjust the air pressure in the airtight space according to a third driving signal and a fourth driving signal (which are described later). For example, when the pump 109 receives the third driving signal, the pump 109 sucks the air among the first portion 111, the second portion 113 and the wafer tray 102, so that the air pressure in the airtight space reaches the preset negative pressure value. When the pump receives the fourth driving signal, the pump 109 inputs the air into the airtight space, to restore the air pressure in the airtight space to the normal pressure value.

Figure 7:
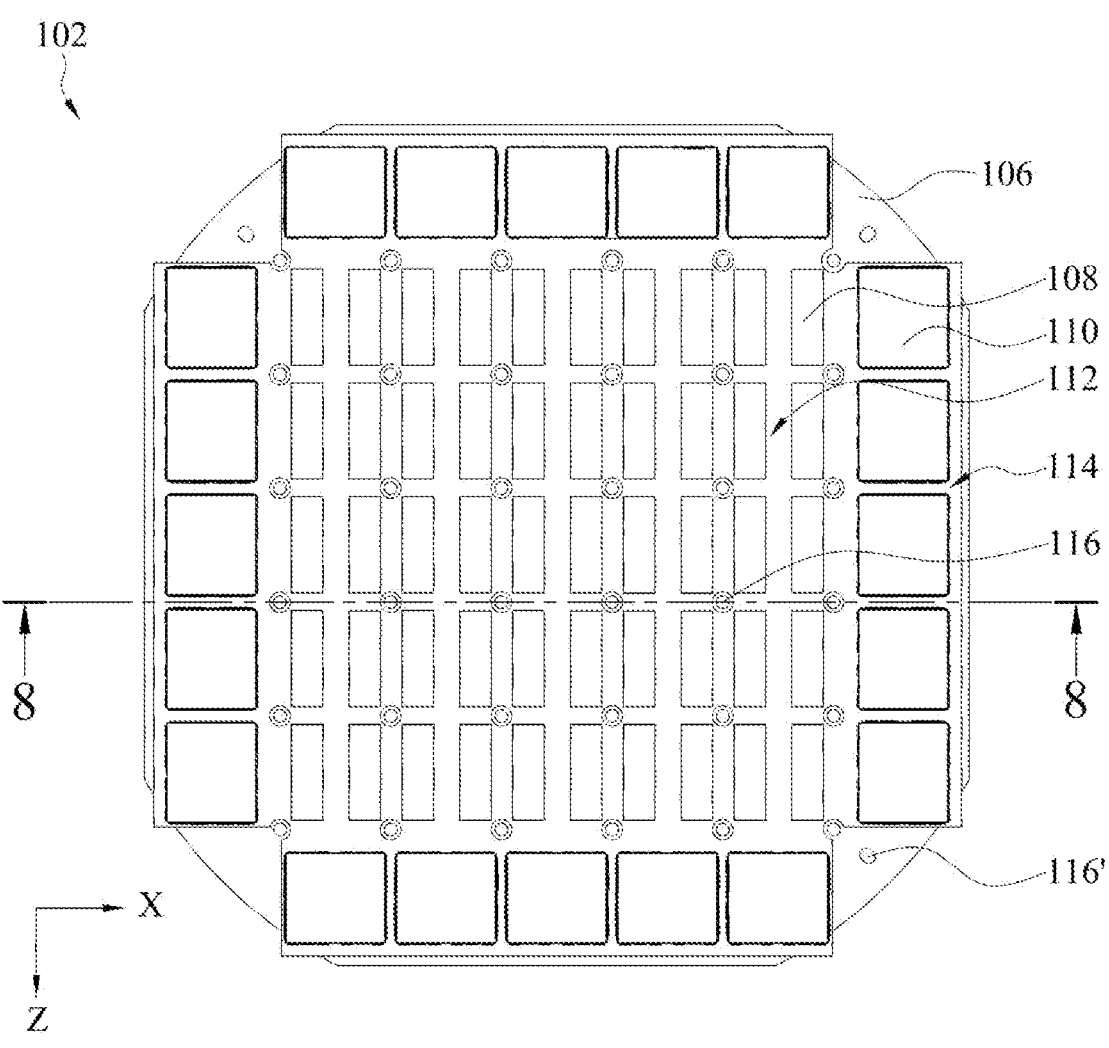
FIG. 7 is a schematic structural diagram of the wafer tray according to some embodiments of the present invention.
Figure 8:
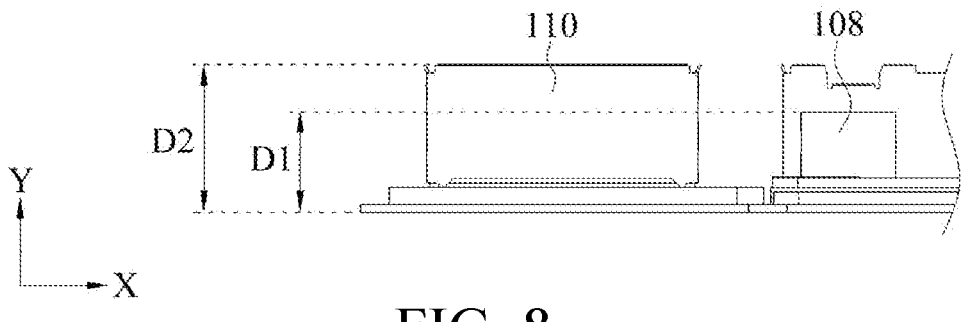
FIG. 8 is a cross-sectional view of the wafer tray in FIG. 7 in a direction 8-8.

Refer to FIG. 7 and FIG. 8. FIG. 7 is a schematic structural diagram of the wafer tray according to some embodiments of the present invention. FIG. 8 is a cross-sectional view of the wafer tray in FIG. 7 in a direction 8-8. As shown in FIG. 1 to FIG. 8, in some embodiments, the wafer tray 102 includes a wafer tray body 106, a first electronic element 108, and a second electronic element 110. In addition, the first electronic element 108 is defined with a first element height D1 and the second electronic element 110 is defined with a second element height D2. The wafer tray body 106 includes a first element arrangement area 112 and a second element arrangement area 114. The first electronic element 108 is arranged in the first element arrangement area 112, and the second electronic element 110 is arranged in the second element arrangement area 114. When the sucker body 105 is connected to the wafer tray 102, the first element arrangement area 112 corresponds to the first portion 111, and the second element arrangement area 114 corresponds to the second portion 113. As shown in FIG. 7, in some embodiments, the wafer tray body 106 is provided with a through hole 116. When the sucker body 105 is connected to the wafer tray 102, the airtight assembly 107 may block the through hole 116 of the wafer tray body 106, so that the airtight space is kept among the first portion 111, the second portion 113, and the wafer tray body 106. In some embodiments, when the sucker body 105 is connected to the wafer tray 102, the abutting portion 123 abuts against the wafer tray body 106, and may further block a through hole 116' at a position of the abutting portion 123 corresponding to that of the wafer tray body 106.

Figure 9:
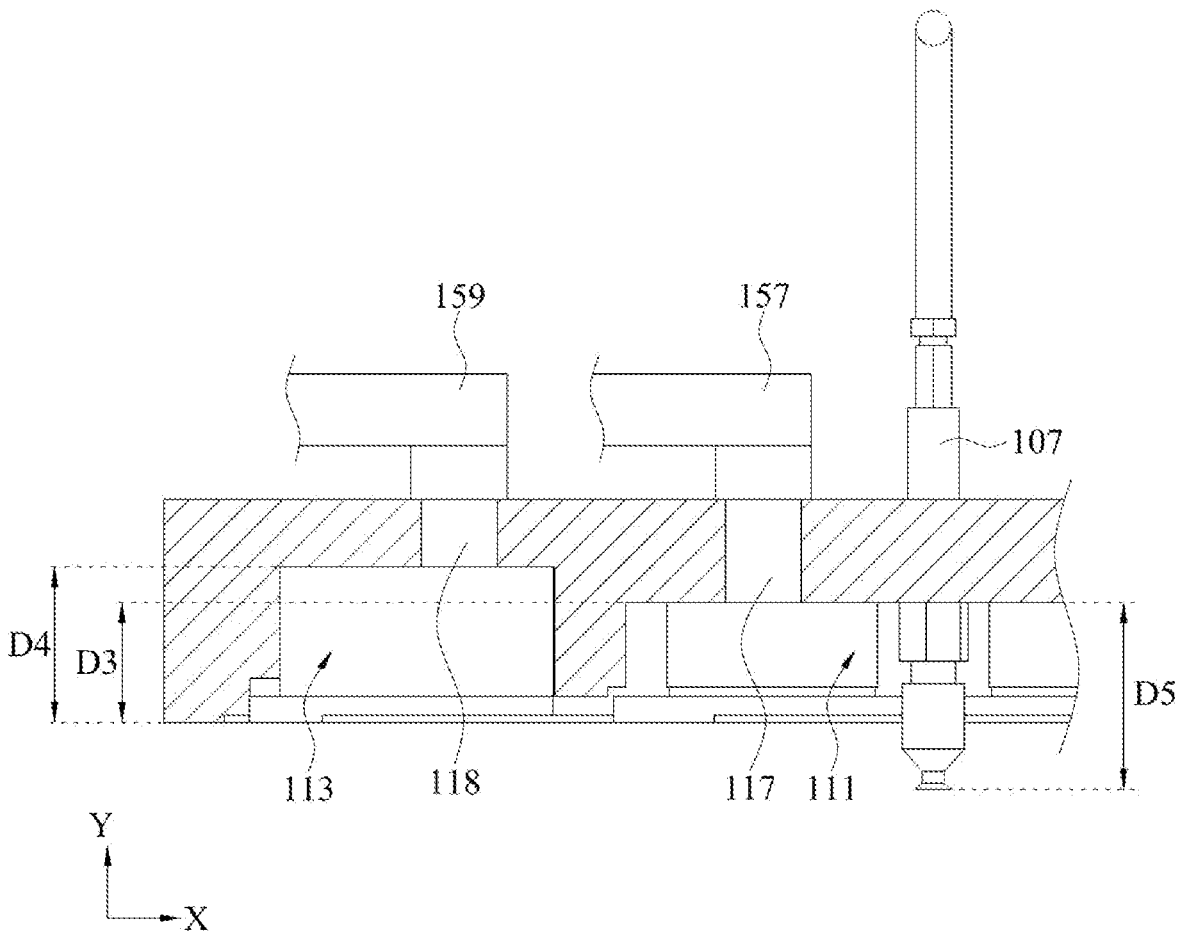
FIG. 9 is a cross-sectional view of the sucker module in FIG. 3 in a direction 9-9.

Refer to FIG. 1 to FIG. 9 together. FIG. 9 is a cross-sectional view of the sucker module in FIG. 3 in a direction 9-9. As shown in FIG. 1 and FIG. 9, in some embodiments, the first portion 111 is defined with a first accommodating height D3 at a direction of a Y axis in the FIG. 9, and the second portion 113 is defined with a second accommodating height D4 at a direction of a Y axis in the FIG. 9. The second accommodating height D4 of the at least one second portion 113 is greater than the first accommodating height D3 of the at least one first portion 111. In some embodiments, when the sucker body 105 is connected to the wafer tray 102, the first electronic element 108 is located between the first element arrangement area 112 and the first portion 111, and the first accommodating height D3 is substantially equal to the first element height D1, and the second electronic element 110 is located between the second element arrangement area 114 and the second portion 113, and the second accommodating height D4 is substantially equal to the second element height D2. Specifically, when the sucker body 105 is connected to the wafer tray 102, the first portion 111 and the second portion 113 are close to each other but do not contact the first electronic element 108 or the second electronic element 110. In this way, the first electronic element 108 and the second electronic element 110 can be prevented from being squeezed by damaged by the sucker body 105 during the engagement of the sucker body 105 with the wafer tray 102.

As shown in FIG. 2 and FIG. 3, in some embodiments, the sucker body 105 has a fixing hole 125. The transporting apparatus 103 further includes a fixing frame 127, a visual module 129, and a controller 131. The fixing frame 127 includes a first fixing portion 133 and a second fixing portion 135. The first fixing portion 133 is connected to the fixing hole 125, the second fixing portion 135 is connected to the transporting apparatus 103, and the fixing frame 127 includes an extended support 137. The visual module 129 is connected to the extended support 137, and the visual module 129 is configured to obtain a first positioning image and a second positioning image. The controller 131 is configured to generate a first driving signal according to the first positioning image and generate a second driving signal according to the second positioning image. In this embodiment, when the first fixing portion 133 is already connected to fixing hole 125, the first fixing portion 133 and fixing hole 125 may be sealed with each other to prevent a pressure leakage between the first fixing portion 133 and fixing hole 125 during the air suction by the pump 109.

As shown in FIG. 3, the visual module 129 may be actuated to capture an environment image, and may obtain the first positioning image and the second positioning image from the environment image (which is described later). The first positioning image may be an image of the wafer tray 102, and the second positioning image may be an image of the carrying member 104. The visual module 129 may start continuously capturing the environment image when the wafer handling device 10 is started. The environment image may alternatively be captured when the visual module 129 detects the wafer tray 102 or the carrying member 104.

As shown in FIG. 2, in some embodiments, the controller 131 is electrically connected to the transporting apparatus 103, the pump 109, and the visual module 129, and is configured to drive the transporting apparatus 103, the pump 109, and the visual module 129. The controller 131 may be, for example, a computer or an apparatus with a human-machine interface. In some embodiments, the controller 131 may store the motion trajectory parameter and an image recognition program. After the controller 131 receives the environment image captured by the visual module 129, the controller 131 may execute the image recognition program to recognize the wafer tray 102 or the carrying member 104 from the environment image through the image recognition program, so as to obtain the first positioning image or the second positioning image. In addition, the controller 131 may obtain an azimuth difference (such as a distance, orientation, or angle difference) between the sucker body 105 and the wafer tray 102 according to the first positioning image, and adjust the motion trajectory parameter according to the azimuth difference and then generate the first driving signal. In addition, the controller 131 may further obtain an azimuth difference between the sucker body 105 and the carrying member 104 according to the second positioning image, and adjust the motion trajectory parameter according to the azimuth difference and then generate the second driving signal. In some embodiments, the controller 131 may generate the third driving signal and the fourth driving signal according to the first handling motion and the second handling motion. For example, the controller 131 generates the third driving signal when the first handling motion is completed (that is to say, the sucker body 105 is at an adsorption position), so that the pump 109 provides a negative pressure to the first portion 111 and the second portion 113 according to the third driving signal. The controller 131 may generate the fourth driving signal when the second handling motion is completed, so that the pump 109 may restore the air pressure among the first portion 111, the second portion 113, and the wafer tray 102 to the normal pressure value according to the fourth driving signal.

As shown in FIG. 2 and FIG. 3, in some embodiments, the transporting apparatus 103 further includes a lighting module 139. The lighting module 139 is connected to the extended support 137. The lighting module 139 is configured to generate a light source. The lighting module 139 is electrically connected to the controller 131. In this way, when the visual module 129 is capturing the environment image, the controller 131 may drive the lighting module 139, so that the lighting module 139 provides the light source to supplement the light. Therefore, the visual module 129 can capture a clearer environment image, and the controller 131 can recognize the environment image more accurately. In some embodiments, the lighting module 139 is arranged around the visual module 129, so that the lighting module 139 can irradiate the light source in an image capturing area of the visual module 129 uniformly.

Figure 10:
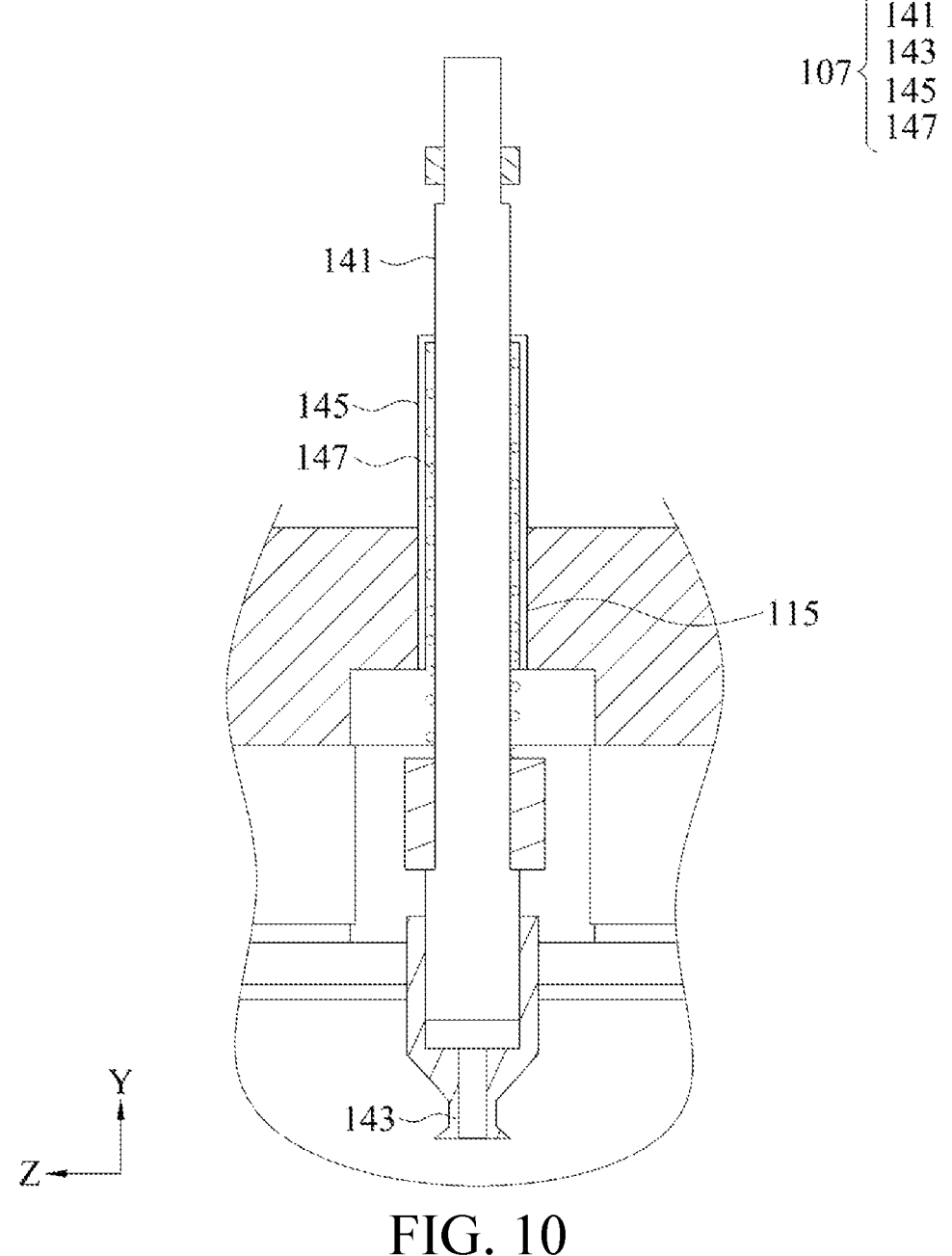
FIG. 10 is a cross-sectional view in which an airtight assembly is fixed to the sucker module according to some embodiments of the present invention.
Figure 11:
FIG. 11 is a cross-sectional view in which the sucker body is connected to the wafer tray and the airtight assembly is engaged with the wafer tray according to some embodiments of the present invention.
Figure 11:
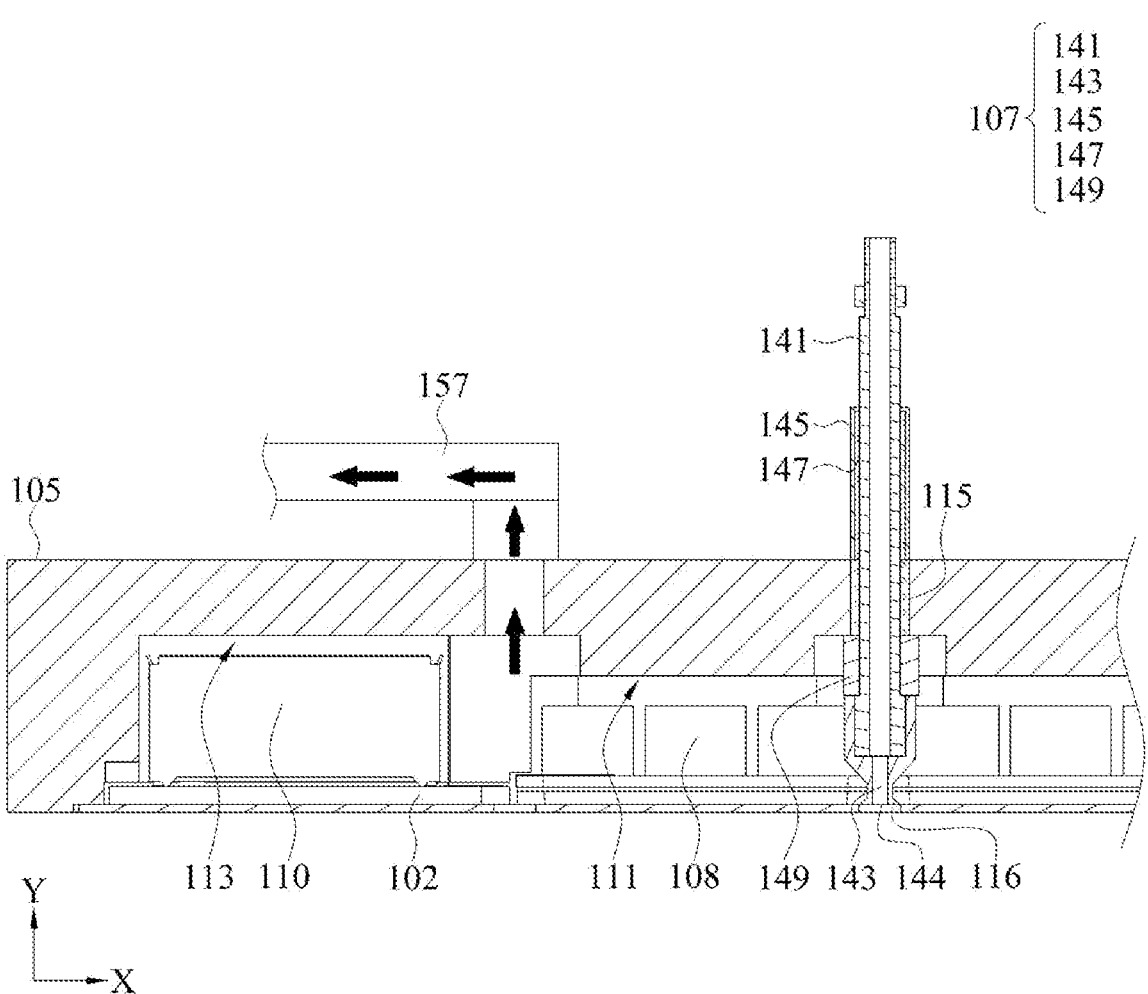

Referring to FIG. 10 and FIG. 11, FIG. 10 is a cross-sectional view in which the airtight assembly is fixed to the sucker module according to some embodiments of the present invention. FIG. 11 is a cross-sectional view in which the sucker body is connected to the wafer tray and the airtight assembly is engaged with the wafer tray according to some embodiments of the present invention. As shown in FIG. 10 and FIG. 11, in some embodiments, the airtight assembly 107 further includes a rod body 141 and a blocking portion 143. The rod body 141 is located in the hole 115, and the blocking portion 143 protrudes from an end of the hole 115. The blocking portion 143 extends to the first portion 111. The blocking portion 143 may be a nozzle or a rubber plug. In some embodiments, a distance D5 between the blocking portion 143 and the hole 115 is greater than the first accommodating height D3 (refer to FIG. 9). The distance D5 is adjusted to substantially equal to the first accommodating height D3 when the sucker body 105 is connected to the wafer tray 102. In some embodiments, the airtight assembly 107 further includes a positioning sleeve 145 and an elastic element 147. The airtight assembly 107 fixed in the hole 115. The rod body 141 includes a stopping portion 149 extending in a radial direction, and the stopping portion 149 is located between the positioning sleeve 145 and the blocking portion 143. The elastic element 147 is sleeved between the rod body 141 and the positioning sleeve 145. The above expression "a distance D5 between the blocking portion 143 and the hole 115 is greater than the first accommodating height and the distance D5 is adjusted to the first accommodating height D3 when the sucker body 105 is connected to the wafer tray 102" may mean that one end of the elastic element 147 abuts against the positioning sleeve 145 and the other end of the elastic element 147 abuts against the stopping portion 149. When the sucker body 105 is connected to the wafer tray 102, the blocking portion 143 is pushed against the wafer tray 102, causing the rod body 141 to move in a Y-axis direction in FIG. 11 relative to the positioning sleeve 145, and the stopping portion 149 moves with the rod body 141 and compresses the elastic element 147, causing the blocking portion 143 to move to the first accommodating height D3. The elastic element 147 may be a spring or a reed. As shown in FIG. 11, when the stopping portion 149 is stopped by the sucker body 105, the sucker body 105 may be engaged with the wafer tray 102 at this moment, and the elastic element 147 may continuously apply an elastic force to the stopping portion 149 after being compressed, so that the blocking portion 143 may continuously generate the support force for the wafer tray 102. In addition, when the sucker body 105 is separated from the wafer tray 102, the blocking portion 143 is be pushed by the elastic element 147 to restore the distance D5.

Figure 12:
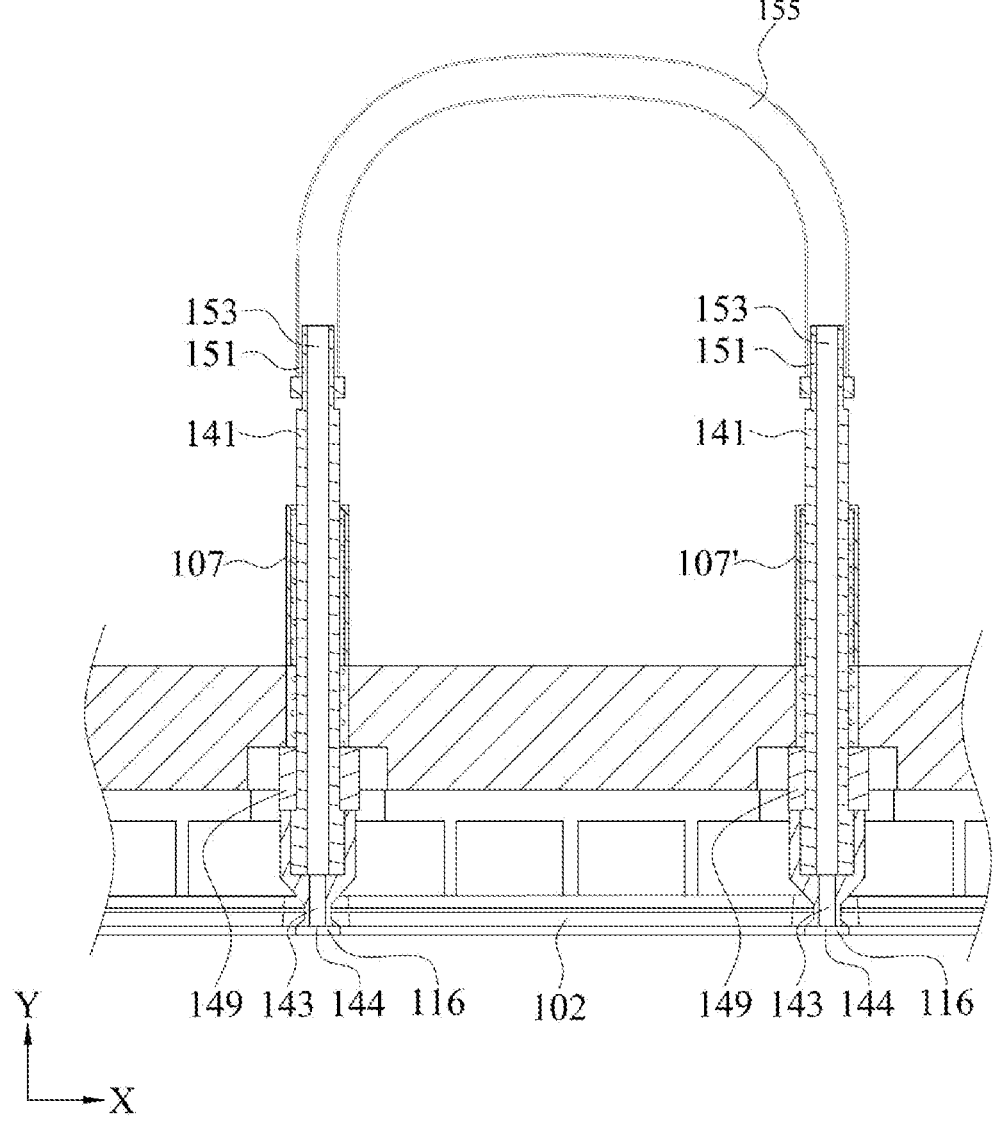
FIG. 12 is a schematic diagram according to some embodiments of the present invention, in which the sucker body is connected to the wafer tray and a connecting tube is connected to two plurality of airtight assemblies.

Referring to FIG. 12, FIG. 12 is a schematic diagram according to some embodiments of the present invention, in which the sucker body is connected to the wafer tray and a connecting tube is connected to two plurality of airtight assemblies. As shown in FIG. 12, in some embodiments, each of the airtight assembly 107 further includes a connecting portion 151, and the rod body 141 has a vent channel 153. The vent channel 153 is in communication with the blocking portion 143 and the connecting portion 151. In this embodiment, the blocking portion 143 has a hole 144. When the sucker body 105 is connected to the wafer tray 102, the hole 144 of the blocking portion 143 may be communicated with the through hole 116. In some embodiments, a plurality of airtight assemblies 107 are arranged. Each of the plurality of the airtight assemblies 107 includes a connecting tube 155, and two ends of each connecting tube 155 are respectively connected to the connecting portions 151 of two of the plurality of airtight assemblies (107, 107'). In this way, when the sucker body 105 is connected to the wafer tray 102, the two of plurality of airtight assemblies (107, 107') can balance the pressure through the connecting tube 155, so that the blocking portion 143 can be stably engaged with the through hole 116 in a negative pressure environment.

As shown in FIG. 1, in some embodiments, the suction tube 119 includes has a first tube 157 and a second tube 159. The first tube 157 is connected to the first air sucking hole 117 of the first portion 111, and the second tube 159 is connected to the second air sucking hole 118 of the second portion 113. In this way, the pump 109 may suck the air from the first portion 111 and the second portion 113 through the first tube 157 and the second tube 159 respectively, and the pump 109 may adjust the pressures of the first portion 111 and the second portion 113 uniformly and stably. In addition, when the sucker body 105 adsorbs the wafer tray 102, the pressures in the first portion 111 and the second portion 113 may be consistent, thereby realizing stable movement of the wafer tray 102.

Based on the above, when the sucker module 101 is connected to the wafer tray 102, the airtight assembly 107 of the sucker module 101 can block the through hole 116 of the wafer tray 102, and the pump 109 can suck the air among the first portion 111, the second portion 113, and the wafer tray 102 to cause the air pressure between sucker body 105 and wafer tray 102 to reach the preset negative pressure value. Besides, each airtight assembly 107 can provide the support force for the wafer tray 102 uniformly, so that the wafer tray 102 can be prevent from bending when the sucker module 101 sucks and moves the wafer tray 102. In addition, the abutting portion 123 of the third portion 121 of the sucker module 101 can also block the gap and the through hole 116' among the first portion 111, the second portion 113, and the wafer tray 102, so as to avoid a pressure leakage among the first portion 111, the second portion 113, and the wafer tray 102.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A wafer handling device, configured to transport a wafer tray, comprising:

a sucker module, comprising:

a sucker body, comprising at least one first portion and at least one second portion, wherein each of the at least one first portion has a hole and a first air sucking hole, and each of the at least one second portion has a second air sucking hole;

at least one airtight assembly, connected to the hole; and a pump, comprising a suction tube, wherein the suction tube is connected to the first air sucking hole and the second air sucking hole; and a transporting apparatus, configured to move the sucker body, wherein a second accommodating height of the at least one second portion is greater than a first accommodating height of the at least one first portion, when the sucker body is connected to the wafer tray, the at least one first portion, the at least one second portion, and the wafer tray form an airtight space.

2. The wafer handling device according to claim 1, wherein at least one partition wall is provided between the at least one first portion and the at least one second portion, and the at least one partition wall separates the at least one first portion from the at least one second portion.

3. The wafer handling device according to claim 2, wherein the sucker body further comprises at least one third portion, the at least one third portion comprises an abutting portion, and the at least one first portion, the at least one second portion, the at least one third portion, and the wafer tray form the airtight space when the sucker body is connected to the wafer tray and the abutting portion abuts against the wafer tray.

4. The wafer handling device according to claim 1, wherein the at least one airtight assembly further comprises a rod body and a blocking portion, the rod body is located in the hole, and the blocking portion protrudes from an end of the hole.

5. The wafer handling device according to claim 4, wherein a distance between the blocking portion and the hole is greater than the first accommodating height.

6. The wafer handling device according to claim 5, wherein the at least one airtight assembly further comprises:

a positioning sleeve, fixed in the hole, wherein the rod body comprises a stopping portion, and the stopping portion is located between the positioning sleeve and the blocking portion; and an elastic element, sleeved between the rod body and the positioning sleeve, wherein the stopping portion compresses the elastic element to move the blocking portion.

7. The wafer handling device according to claim 6, wherein each of the at least one airtight assembly further comprises a connecting portion, the rod body is located between the connecting portion and the blocking portion, the connecting portion protrudes from an other end of the hole, and the rod body has a vent channel, and the vent channel is in communication with the connecting portion and the blocking portion.

8. The wafer handling device according to claim 7, wherein the at least one airtight assembly is a plurality of airtight assemblies, each of the plurality of the airtight assemblies comprises a connecting tube, and two ends of each connecting tube are respectively connected to the connecting portions of two of the plurality of airtight assemblies.

9. The wafer handling device according to claim 1, wherein the sucker body has a fixing hole, and the transporting apparatus further comprises:

a fixing frame, comprising a first fixing portion and a second fixing portion, wherein the first fixing portion is connected to the fixing hole, the second fixing portion is connected to the transporting apparatus, and the fixing frame comprises an extended support;

a visual module, connected to the extended support and configured to obtain a first positioning image and a second positioning image; and a controller, configured to generate a first driving signal according to the first positioning image and generate a second driving signal according to the second positioning image.

10. The wafer handling device according to claim 9, wherein the transporting apparatus further comprises a lighting module, and the lighting module is connected to the extended support.

11. A sucker module, comprising:

a sucker body, comprising at least one first portion and at least one second portion, wherein each of the at least one first portion has a hole and a first air sucking hole, and the at least one second portion has a second air sucking hole;

at least one airtight assembly, connected to the hole; and a pump, comprising a suction tube, wherein the suction tube is connected to the first air sucking hole and the second air sucking hole, wherein a second accommodating height of the at least one second portion is greater than a first accommodating height of the at least one first portion, when the sucker body is connected to a wafer tray, the at least one first portion, the at least one second portion, and the wafer tray form an airtight space.

12. The sucker module according to claim 11, wherein at least one partition wall is provided between the at least one first portion and the at least one second portion, and the at least one partition wall separates the at least one first portion from the at least one second portion.

13. The sucker module according to claim 12, wherein the sucker body further comprises at least one third portion, the at least one third portion comprises an abutting portion, and the at least one first portion, the at least one second portion, the at least one third portion, and the wafer tray form the airtight space when the sucker body is connected to the wafer tray and the abutting portion abuts against the wafer tray.

14. The sucker module according to claim 11, wherein the at least one airtight assembly further comprises a rod body and a blocking portion, the rod body is located in the hole, and the blocking portion protrudes from an end of the hole.

15. The sucker module according to claim 14, wherein a distance between the blocking portion and the hole is greater than the first accommodating height.

16. The sucker module according to claim 15, wherein the at least one airtight assembly further comprises:

a positioning sleeve, fixed in the hole, wherein the rod body comprises a stopping portion, and the stopping portion is located between the positioning sleeve and the blocking portion; and an elastic element, sleeved between the rod body and the positioning sleeve, wherein the stopping portion compresses the elastic element to move the blocking portion.

17. The sucker module according to claim 16, wherein each of the at least one airtight assembly further comprises a connecting portion, the rod body is located between the connecting portion and the blocking portion, the connecting portion protrudes from an other end of the hole, and the rod body has a vent channel, and the vent channel is in communication with the connecting portion and the blocking portion.

18. The sucker module according to claim 17, wherein the at least one airtight assembly is a plurality of airtight assemblies, each of the plurality of the airtight assemblies comprises a connecting tube, and two ends of the each connecting tube are respectively connected to the connecting portions of two of the plurality of airtight assemblies.

\* \* \* \* \*